United States Patent [19]

Mountz

[11] Patent Number: 4,963,833
[45] Date of Patent: Oct. 16, 1990

[54] HIGH POWERED AMPLIFIER AND HEAT SINKING APPARATUS

[75] Inventor: Michael C. Mountz, Carol Stream, Ill.

[73] Assignee: Motorola, Inc., Schaumburg, Ill.

[21] Appl. No.: 364,385

[22] Filed: Jun. 12, 1989

[51] Int. Cl.$^5$ .............................................. H03F 1/00
[52] U.S. Cl. ........................................ 330/65; 330/68; 330/289
[58] Field of Search ..................... 330/65, 66, 68, 289; 361/388, 389

[56] References Cited

U.S. PATENT DOCUMENTS 3,265,982  8/1966  Wilhelmsen ...................... 330/68 X
4,151,479  4/1979  Baba ................................... 330/65 X

OTHER PUBLICATIONS

Murase et al, "Heat Pipe Heat Sink 'Heat Kicken' For Cooling of Semiconductors," The Furukawa Electric Co., Ltd.

Owner's Manual, 75 Watt Power Amplifier Deck, Model TTF 1440 (850–875 MHz), Motorola, Inc., Apr. 22, 1988.

Primary Examiner—James B. Mullins
Attorney, Agent, or Firm—Timothy W. Markison; Steven G. Parmelee; Joseph P. Krause

[57] ABSTRACT

An improved high powered power amplifier, where the improvement comprises an improved grounding technique by decreasing the contact resistance, and an improved thermal transfer and dissipating technique. The heat generated by a power amplifier device is transferred and dissipated substantialy outside a chassis and is in direct contact with a heat sinking device located outside the chassis. By having the heat transfer and heat dissipation occurring outside the chassis and by having the power amplifier device in direct contact with the heat sinking device, the power amplifier is capable of reliably operating at higher power levels.

7 Claims, 2 Drawing Sheets

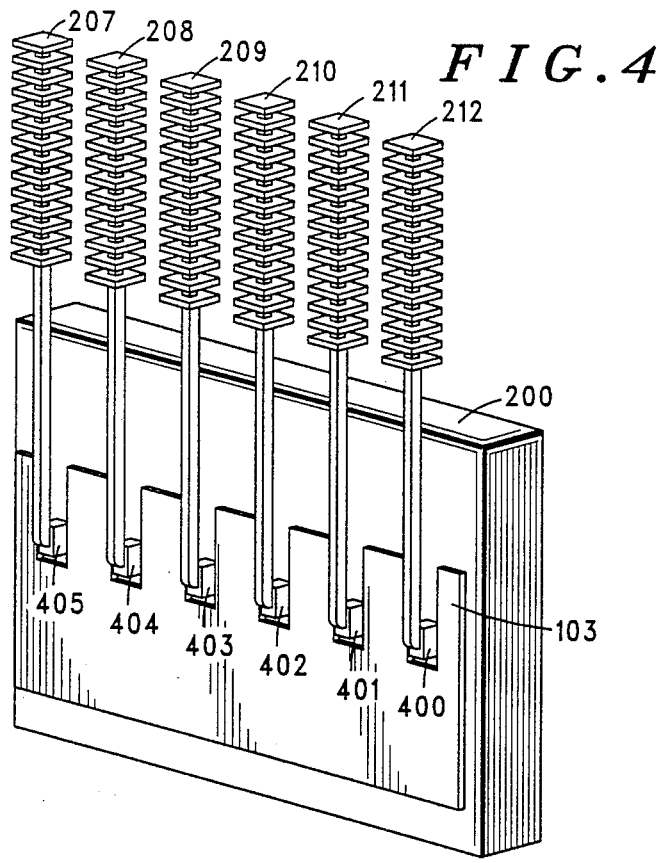
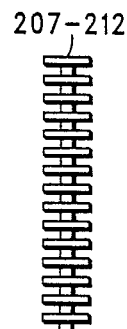
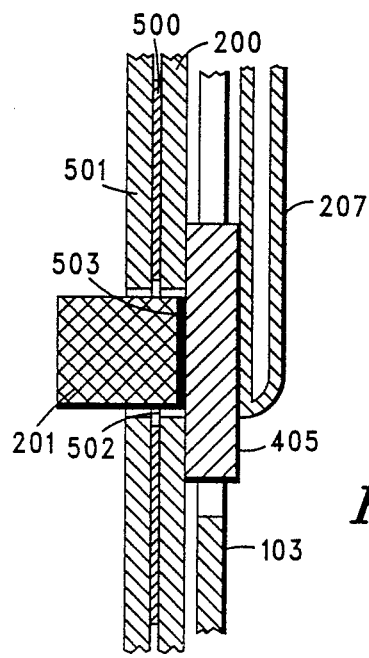
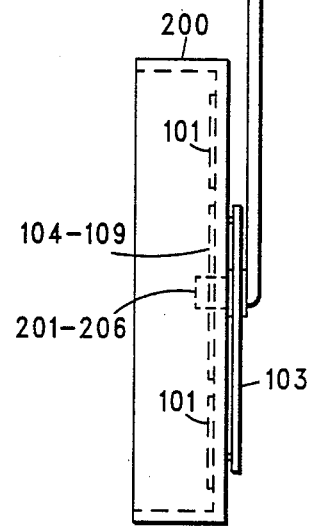
FIG. 4
FIG. 3
FIG. 5

HIGH POWERED AMPLIFIER AND HEAT SINKING APPARATUS

TECHNICAL FIELD

This invention relates generally to high powered power amplifiers and in particular to an improved power amplifier heat sinking apparatus and to an improved grounding technique.

BACKGROUND OF THE ART

High powered radio frequency (RF) power amplifiers typically comprise an RF amplifying circuit, a DC source and/or distribution circuit, a chassis, and heat sinks. The RF amplifying circuit generally consists of impedance matching circuitry and a power amplifier device (usually transistors), such that RF signals are amplified. The RF amplifying circuit is connected to the chassis, where the chassis provides an RF ground path and mechanical support for the RF amplifying circuit. When the power amplifier device is amplifying RF signals it produces a substantial amount of heat; RF amplifying circuits are approximately 55% efficient. The power level of RF amplifiers can be increased by paralleling RF amplifying circuits, thus creating even more heat. Heat sink extrusions or heat sink castings, mounted on the back of the chassis, are typically used to dissipate the heat. A difficulty arises in getting the heat from the power amplifier device, which is typically located within the chassis, to the externally mounted heat sink extrusions or heat sink castings.

One technique is to use low thermal resistant heat sink interface devices (typically cooper bars or blocks) to develop a heat transfer path from the power amplifier device to the heat sink extrusions or heat sink castings. This method requires appropriate hardware to assure that the interface between the power amplifier device, the copper bar, and the heat sink extrusion maintains a low thermal resistance. In addition to the parts required, the interfacing device has thermal resistance which limits the heat transferred from the power amplifier device to the heat sink. Another method is to mount the power amplifier device directly on the externally mounted heat sink extrusions and connect it to the appropriate circuitry located within the chassis by wires or printed circuit board connections. This method reduces the thermal resistance of the heat transfer path but may present serious RF interference problems including electromagnetic interference (EMI).

Another important design aspect of high powered RF power amplifiers is the grounding of the RF amplifying circuit and the DC source and/or distribution circuit. In most high powered RF amplifiers, both the RF amplifying circuit and the DC source and/or distribution circuit are located within the chassis and grounded to it. Having both circuits within the chassis is primarily dictated by the fact that the heat sink extrusions or heat sink castings are so large that there is no other place to put them. The grounding of the circuits is usually done through conductive standoffs which create several low impedance paths to the chassis. Generally, the more conductive standoffs there are, the lower the total impedance will be, thus creating a better ground path. However, the use of conductive standoffs may result in distributed ground impedances or various contact impedances between the circuit and the standoff. Variations in the ground impedance may produce circulating ground currents which can impede or destroy the amplifier's performance.

In addition to providing a low impedance ground connection, the high powered amplifier must be designed to limit the effects of the RF interferences. Most power amplifier circuits use RF shields to enclose the RF amplifying circuit to limit the radiation or interception of Rf interferences. This technique generally requires hardware to hold the shield in place and makes the internal packaging of the power amplifier difficult.

A 600 Watt, class C power amplifier incorporating the above mentioned design features has a total of about 240 parts and weighs about 80 pounds.

Some lower powered RF amplifiers, 450 Watts for a class B amplifier, 80 Watts for a class A amplifier, use internally mounted heat pipes to dissipate the heat generated by the power amplifier devices. This technique substantially reduces the overall weight, but it increases the internal ambient temperature, does not reduce the part count, and generally creates more internal EMI. By having the internal ambient temperature higher, higher grade temperature components may be required, thus increasing the cost.

A need exists for a high powered power amplifier that requires substantially fewer parts, that weighs substantially less than a power amplifier using heat sink extrusions or heat sink castings, that has an improved thermal connection between the power amplifier device and the heat sink, that has an improved method of reducing the RF interference effects, and that has an improved ground system.

SUMMARY OF THE INVENTION

These needs and others are substantially met by the high powered power amplifier and heat sinking apparatus disclosed herein. The improved RF power amplifier consists of an RF shield having a shielding region, an RF amplifier circuit that is located substantially within the shielding region for amplifying RF input signals, and a DC source and/or distribution circuit that supplies DC voltages to the RF amplifying circuit. The RF amplifying circuit consists of impedance matching circuitry, and at least one power amplifier device having a primary heat transfer area. The improvement comprises a substantially planer substrate on which the RF amplifying circuit is deposited, a ground plane, an exposing device and a heat sinking device. The substrate comprises electrical connections between the impedance matching circuitry and the power amplifier device, and at least one conductive ground layer that is electrically connected to the ground plane. The exposing device exposes the primary heat transfer area to the heat sink device which is located substantially outside the shielding region.

In one embodiment, the RF shield and the ground plane combine to form a PA chassis such that the shielding region is within the PA chassis. The RF amplifying circuit and the heat sink device are modular. The DC distribution circuit and the heat sink device modules are located outside the shielding region, and the conductive ground layers of the RF amplifying circuit modules are physically and electrically connected to the PA chassis. The exposing device is a cutout in the PA chassis such that each primary heat transfer area is thermally connected to a heat sink device.

In another embodiment, the heat sink device is a heat pipe located substantially outside the shielding region.

The primary heat transfer area thermally connects to the heat pipe through an opening in the RF shield.

BRIEF DESCRIPTION OF THE DRAWINGS

FIG. 3 illustrates a side view of the modular RF power amplifier's physical layout.

FIG. 4 illustrates a back view of the modular RF power amplifier's physical layout.

FIG. 5 illustrates a cross-sectional view of the thermal connect between the power amplifying device and the heat sink device.

BEST MODE FOR CARRYING OUT THE INVENTION

Figure 1:
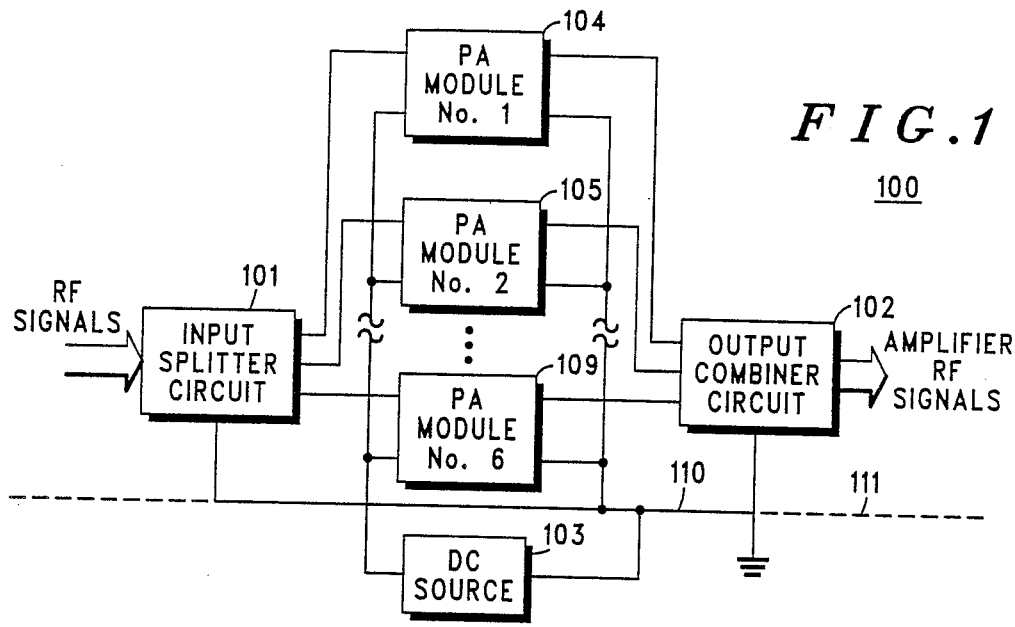
FIG. 1 illustrates an electrical block diagram of a modular AF power amplifier.

FIG. 1 illustrates an electrical block diagram of a modular high powered power amplifier (100) comprising an input splitter circuit (101), six power amplifier modules (104–109) (modules #3, #4, and #5 are not shown), an output combiner circuit (102), a DC source and/or distribution circuit (103), a common ground reference (110), and an RF shield (111). The input splitter circuit (101) receives RF input signals and evenly distributes them to each power amplifier module (104–109). The outputs of the power amplifier modules (104–109) are combined in the output combiner circuit (102) to form the amplified Rf signals. The DC source and/or distribution circuit (103) may be a DC power supply or a distribution circuit that receives DC voltages from an external DC supply and distributes them throughout the power amplifier (100) or any combination thereof. In any implementation, the DC source (103) supplies DC voltages to the power amplifier modules (104–109). FIG. 1 depicts the power amplifier (100) in a modular form, however, the present invention is equally applicable to non-modular power amplifier designs.

The RF shield (111) shields the DC source (103) from RF interferences including electromagnetic interference (EMI) generated by the input splitter circuit (101), the six power amplifier modules (104–109), and the output combiner circuit (102). The RF shield (111) also shields the power amplifier (100) from radiating or intercepting external RF interferences. The common ground (110) provides a common return path for all the circuit elements (101–109). In a physical embodiment, a chassis, which houses the six power amplifier modules (104–109), the input splitter circuit (101), and the output combiner circuit (102) and supports the DC source (103) on an exterior surface, generally acts as both the RF shield (111) and the common ground (110). By having the DC source (103) mounted outside the chassis with the remainder of the circuitry being mounted on the inside of the chassis, the desired RF interference shielding is obtained.

Figure 2:
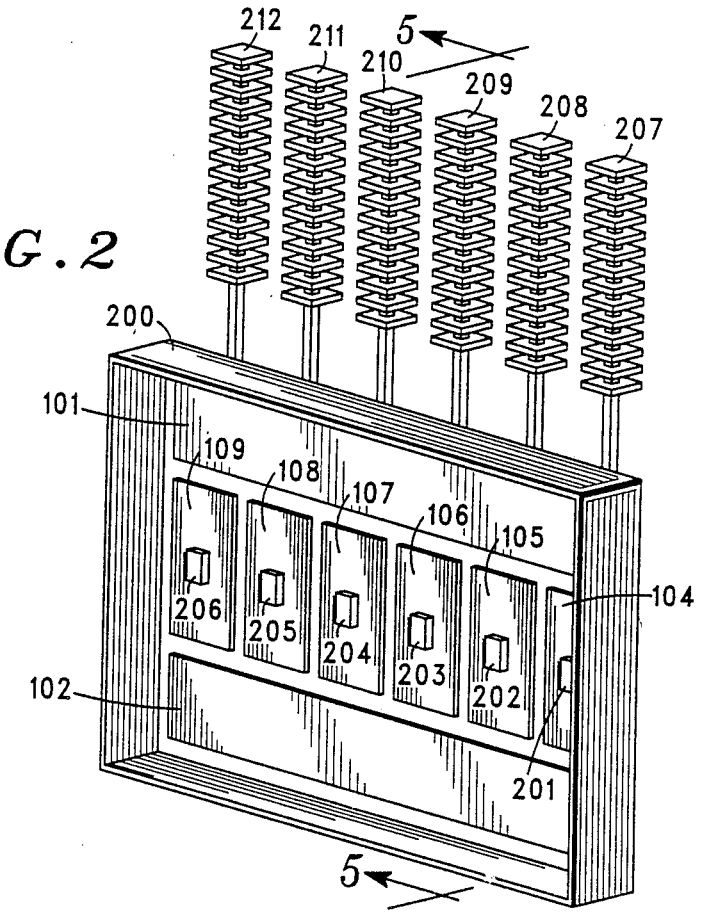
FIG. 2 illustrates a front view (cover removed) of the modular RF power amplifier's physical layout.

FIGS. 2, 3, and 4 illustrate, in a front, side, and rear view, respectively, one of many possible power amplifier (100) layouts. In FIG. 2, the six power amplifier modules (104–109) are shown having a power amplifier device (201–206) and are shown centrally mounted inside a PA chassis (200). The input splitter circuit (101) and the output combiner circuit (102) are located inside the PA chassis (200) above and below the power amplifier modules (104–109), respectively. Also shown are six heat sinking devices (207-14 212) mounted substantially outside and on the rear of the PA chassis (200). In FIG. 3, the heat sinking devices (207-212) are shown physically attached to the power amplifier devices (201-206), and the DC source (103) is shown mounted substantially outside and on the rear of the PA chassis (200). The heat sinking devices (207-212) are attached to the PA chassis (200) in an appropriate manner (not shown). In FIG. 4, the DC source (103) is more clearly illustrated. FIG. 4 also illustrates the heat sinking devices (207-212) having an input area (400-405).

The PA chassis (200), as mentioned above, can act as both the RF shield (111) and the common ground (110). A typical PA chassis (200) is comprised of a sheet metal construction, where inside the chassis is the shielding region. The PA chassis (200) may also be plated with a more conductive material, thus lowering the impedance of the chassis and improving its grounding characteristics. It is not imperative that the PA chassis (200) act as both the RF shield (111) and the common ground (110), nor is it imperative that it be made of sheet metal, however, it is probably the most practical design when considering both cost and parts count.

The power amplifier modules (104–109), the input splitter circuit (101), the output combiner (102), and the DC source (103) are comprised of a substrate having a conductive ground layer on one major surface. The substrates may be multi-layer printed circuit boards having several ground layers, but at least one ground layer has to be on an outer surface such that it can interface with the PA chassis (200). Having the modular power amplifier layout as described above, the power amplifier modules (104–109), the input splitter circuit (101), and the output combiner circuit (103) an be mounted directly to the PA chassis (200). By having the entire ground layer in contact with the PA chassis (200), as compared with the conductive standoff technique described in the background section the contact resistance is reduced thus the grounding is improved.

In addition to improving the grounding, the direct interface technique improves the thermal dissipation of the substrates in comparison with the described prior art. With the substrates in direct contact with the PA chassis (200), the thermal resistance is reduced, thus the substrates run cooler. This feature and the improved thermal resistance of a power amplifier device (201-206) to a heat sinking device (207-212) is more clearly illustrated in FIG. 5.

FIG. 5 illustrates a typical cross sectional view of a power amplifier module (104–109), the PA chassis (200), the DC source (103), and a heat sinking device (207-212). The power module is shown comprising a substrate (501) having a ground layer (500) and a power amplifier device (201-206) having a primary heat transfer area (503). The PA chassis (200) is shown having an opening, or cutout (502) just large enough to expose the primary heat transfer area (503) to outside the PA chassis (200). An input area (400-405) of a heat sinking device (207-212) is shown in direct contact with the primary heat transfer area (503) such that the heat transfer and heat dissipation take place substantially outside PA chassis (200). With the heat transfer and heat dissipation taking place substantially outside the PA chassis (200), the internal ambient temperature is lower than the described prior art. It should be noted that an input area (400-405) could be so configured as to extend into the PA chassis (200) to directly interface with the primary heat transfer area (503) and still have the heat transfer and heat dissipation occurring substantially outside the PA chassis (200).

In addition to having the heat transfer and heat dissipation taking place substantially outside the PA chassis (200), the direct contact between the primary heat transfer area (503) and a heat sinking device (207-212) lowers the thermal resistance. For example, where heat pipes represent the heat sinking devices (207-212), and a power transistor having a primary heat transfer area represents a power amplifier device (201-206), the power amplifier (100) is capable of dissipating about 100 Watts per 3 square centimeters +/−10%. In comparison, the heat sink extrusions system described in the background is limited to dissipating about 100 Watts per 23 square centimeters. The thermal interface device h as a slightly higher dissipation ratio.

The module concept illustrated in FIGS. 2 through 4 allows various amplifier topologies to be used. Any of the amplifier classifications, A, AB, B, or C, may be implemented using this modular technique. FIGS. 2 through 4 also illustrate six power amplifier modules (104-109) having power amplifier devices (201-206) where the power amplifier devices (201-206) can be power transistors having a primary heat transfer area. The transistor packaging may be either typical packaging configurations, surface mount packaging, or specially designed packaging. Whichever type of packaging is used, a thermal surface or area is provided to act as the primary heat transfer area such that heat can be removed from the power amplifier device (201-206). A typical power module (104-109) has an output power rating of up to 100 watts +/−10%. The modularity concept of power amplifier (100) allows these modules (104-109) to be replaced with three power amplifier modules each having an output power rating of up to 200 watts +/−10% without having to change the input splitter circuit (101), the output combiner circuit (102), or the heat sinking devices (207-212).

By using heat pipes as the heat sinking devices (207-212) and by having the substrates directly mount to the PA chassis (200), the total parts count has been reduced to at most about 70 parts and the total weight of the power amplifier (100) has been reduced to at most about 15 pounds for a 600 Watt, class C power amplifier. Thus, in addition to improving the thermal characteristics of the power amplifier (100), which allows the it to reliably operate at higher power levels, and improving the grounding of the power amplifier (100), the present invention also substantially reduces the parts count and substantially reduces the weight in comparison with the prior art.

What is claimed is:

1. An improved radio frequency (RF) power amplifier having:

power amplifier chassis means for providing an enclosed RF shielding region, for housing at least part of the RF power amplifier, and by providing a ground plane;

power amplifier means, operably associated with the power amplifier chassis means and located substantially within the enclosed RF shielding region, for amplifying RF signals, the power amplifier means including, at least;

a power amplifying module consisting of, at least, a substrate having at least one major surface and a power transistor having a primary heat transfer area; and RF signal receiving means having a substrate with at least one major surface, operably associated with the power amplifier module, for receiving RF signals;

DC source means, operably associated with the power amplifier means and the power amplifier chassis means, for supplying at least one DC voltage to the power amplifier means;

wherein the improvement comprises:

exposing means, operably associated with the power amplifier chassis means, for exposing the primary heat transfer area to outside the enclosed RF shielding region; and heat sinking means, operably coupled to the primary heat transfer area and located substantially outside the enclosed RF shielding region of the power amplifier chassis means, for transferring and dissipating heat generated by the power transistor substantially outside the enclosed RF shielding region.

2. The improved RF amplifier of claim 1 wherein the heat sinking means comprises at least one heat pipe.

3. The improved RF amplifier of claim 1 wherein the DC source means is located substantially outside the enclosed RF shielding region such that the DC source means is shielded from RF interferences, including electromagnetic interferences (EMI), generated by the power amplifier means.

4. The improved RF amplifier of claim 1 wherein the power amplifier chassis means comprises a sheet metal construction.

5. The improved Rf amplifier of claim 1 wherein the power amplifier module is improved to comprise a ground plane, having substantially the same dimensions as the major surface, deposited on the major surface and directly coupled to the ground plane of the power amplifier chassis means such that the power amplifier module is grounded to the power amplifier means.

6. The improved RF amplifier of claim 5 wherein the Rf signal receiving means is improved to comprise a ground plane, having substantially the same dimensions as the major surface, deposited on the major surface and directly coupled to the ground plane of the power amplifier chassis means such that the RF signal receiving means is grounded to the power amplifier chassis means.

7. The improved RF amplifier of claim 6 wherein the heat dissipation is at least of 100 Watts/3 sq. cm.

\* \* \* \* \*